US010090035B2

(12) United States Patent
Kim

(10) Patent No.: US 10,090,035 B2
(45) Date of Patent: Oct. 2, 2018

(54) SEMICONDUCTOR DEVICES HAVING SEPARATE SOURCE LINE STRUCTURE

(71) Applicant: Chan Kyung Kim, Hwaseong-si (KR)

(72) Inventor: Chan Kyung Kim, Hwaseong-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 15/388,419

(22) Filed: Dec. 22, 2016

(65) Prior Publication Data

US 2017/0221538 A1  Aug. 3, 2017

(30) Foreign Application Priority Data

Jan. 28, 2016  (KR) .................. 10-2016-0010965

(51) Int. Cl.
*G11C 7/06* (2006.01)
*G11C 7/10* (2006.01)
*G11C 11/16* (2006.01)

(52) U.S. Cl.
CPC ...... *G11C 11/1673* (2013.01); *G11C 11/1675* (2013.01); *G11C 11/1697* (2013.01)

(58) Field of Classification Search
CPC ............ G11C 11/1673; G11C 11/1675; G11C 11/1697; G11C 5/147; G11C 7/22; G11C 13/0004; G11C 13/0023; G11C 13/0033; G11C 13/0069; G11C 13/0097; G11C 2013/0092; G11C 2213/71; G11C 5/14
See application file for complete search history.

(56) References Cited

U.S. PATENT DOCUMENTS

| 7,778,068 | B2 | 8/2010 | Kawahara et al. |
| 7,821,819 | B2 | 10/2010 | Hachino |
| 7,916,556 | B2 | 3/2011 | Kitagawa et al. |
| 8,254,195 | B2 | 8/2012 | Rao |
| 8,456,930 | B2 | 6/2013 | Hwang |
| 8,897,061 | B2 | 11/2014 | Ezaki |
| 2006/0232303 | A1* | 10/2006 | Li ...................... G11C 7/065 327/51 |
| 2010/0259965 | A1* | 10/2010 | Kurjanowicz ......... G11C 17/16 365/94 |
| 2013/0148429 | A1 | 6/2013 | Kim et al. |
| 2014/0003124 | A1* | 1/2014 | Youn .................... G11C 13/004 365/148 |
| 2014/0098599 | A1 | 4/2014 | Kim |
| 2015/0035032 | A1 | 2/2015 | Kang et al. |

* cited by examiner

*Primary Examiner* — Hien Nguyen
(74) *Attorney, Agent, or Firm* — Harness, Dickey & Pierce, P.L.C.

(57) ABSTRACT

A semiconductor device includes a bit-line sense amplifier (S/A) circuit configured to sense and amplify data stored in a resistive memory cell according to a reference current. The bit-line S/A circuit includes a cross-coupled latch circuit and a write latch circuit. The cross-coupled latch circuit is coupled to an input/output circuit via a first line and a complementary first line. The cross-coupled latch circuit is configured to receive write data via the first line, and to latch the write data during a data write operation. The write latch circuit is coupled to the cross-coupled latch circuit, and configured to store the write data in the resistive memory cell via a second line during the data write operation.

19 Claims, 13 Drawing Sheets

SEMICONDUCTOR DEVICES HAVING SEPARATE SOURCE LINE STRUCTURE

CROSS-REFERENCE TO RELATED APPLICATION

This application claims priority under 35 U.S.C. § 119 to Korean Patent Application No. 10-2016-0010965, filed on Jan. 28, 2016, in the Korean Intellectual Property Office, the disclosure of which is incorporated herein in its entirety by reference.

BACKGROUND

Field

One or more example embodiments of inventive concepts relate to semiconductor devices, and more particularly, to semiconductor memory devices having a separate source line structure.

Description of Related Art

In general, semiconductor memory devices may be classified as nonvolatile memory devices and volatile memory devices.

A magnetic random access memory (MRAM) is a resistive memory, which is a type of nonvolatile semiconductor memory device, in which stored data is retained even if supply of power to the MRAM is stopped. In a MRAM, a data value stored in a cell thereof is determined according to whether a resistance value is high or low.

A spin torque transfer-magnetic random access memory (STT-MRAM) is referred to as a universal memory device, which may have the relatively low price of a dynamic random access memory (DRAM), while also having the relatively high memory capacity and relatively high operating speed of a static random access memory (SRAM), and nonvolatile characteristics of a flash memory.

A bit-line sense amplifier (BLSA) is needed to operate the STT-MRAM at relatively high speeds.

In the case of a STT-MRAM, chip size and a write voltage may vary according to an arrangement of source lines. In this regard, the number of source lines to be arranged may be reduced to reduce the chip size.

A nonvolatile semiconductor memory device having a common source line structure is relatively small in chip-size overhead, but requires a relatively high write voltage and a repair operation in which a defective memory cell is replaced with a spare memory cell.

Furthermore, in a nonvolatile semiconductor memory device having a separate source line structure, chip-size overhead is relatively high since source lines are respectively provided for all bit lines.

SUMMARY

At least one example embodiment provides a semiconductor device having a separate source line structure. According to at least this example embodiment, the semiconductor device includes: a resistive memory cell connected between a bit line and a source line, the resistive memory cell configured to store data; a source-line voltage supply circuit configured to apply a read source line voltage to the source line in response to a read column selection signal during a data read operation; a reference current generation circuit configured to generate reference current; a bit-line sense amplifier (S/A) circuit configured to sense and amplify the data stored in the resistive memory cell based on a comparison between cell current and the reference current, the cell current based on the data stored in the resistive memory cell; a read switching circuit between the resistive memory cell and the bit-line S/A circuit, the read switching circuit configured to operate in response to the read column selection signal; and a write switching circuit between the resistive memory cell and the bit-line S/A circuit, the write switching circuit configured to operate in response to a write column selection signal for writing data to the resistive memory cell.

At least one other example embodiment provides a semiconductor device having a separate source line structure. According to at least this example embodiment, the semiconductor device includes: a resistive memory cell connected between a bit line and a source line, the resistive memory cell configured to store data; a reference current generation circuit configured to generate reference current; and a bit-line sense amplifier (S/A) circuit configured to sense and amplify the data stored in the resistive memory cell based on the reference current. The bit-line S/A circuit includes: a first line connected to the resistive memory cell, the first line configured to read the stored data from the resistive memory cell; a second line connected to the reference current generation circuit, the second line configured to read the stored data from the resistive memory cell; a third line configured to output the data read from the resistive memory cell to an input/output (I/O) circuit; a fourth line connected to the resistive memory cell, the fourth line configured to write data to the resistive memory cell; a fifth line, which is complementary to the third line, the fifth line configured to output complementary data for the read data to the I/O circuit; a cross-coupled latch circuit configured to receive write data via the third line and latch the write data during a data write operation; and a write latch circuit. The write latch is configured to: receive the write data output from the cross-coupled latch circuit; and store the write data in the resistive memory cell via the fourth line during the data write operation.

At least one other example embodiment provides a semiconductor device comprising a bit-line sense amplifier (S/A) circuit configured to sense and amplify data stored in a resistive memory cell according to a reference current. The bit-line S/A circuit includes: a cross-coupled latch circuit coupled to an input/output circuit via a first line and a complementary first line, the cross-coupled latch circuit configured to receive write data via the first line, and to latch the write data during a data write operation; and a write latch circuit coupled to the cross-coupled latch circuit, the write latch circuit configured to store the write data in the resistive memory cell via a second line during the data write operation.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
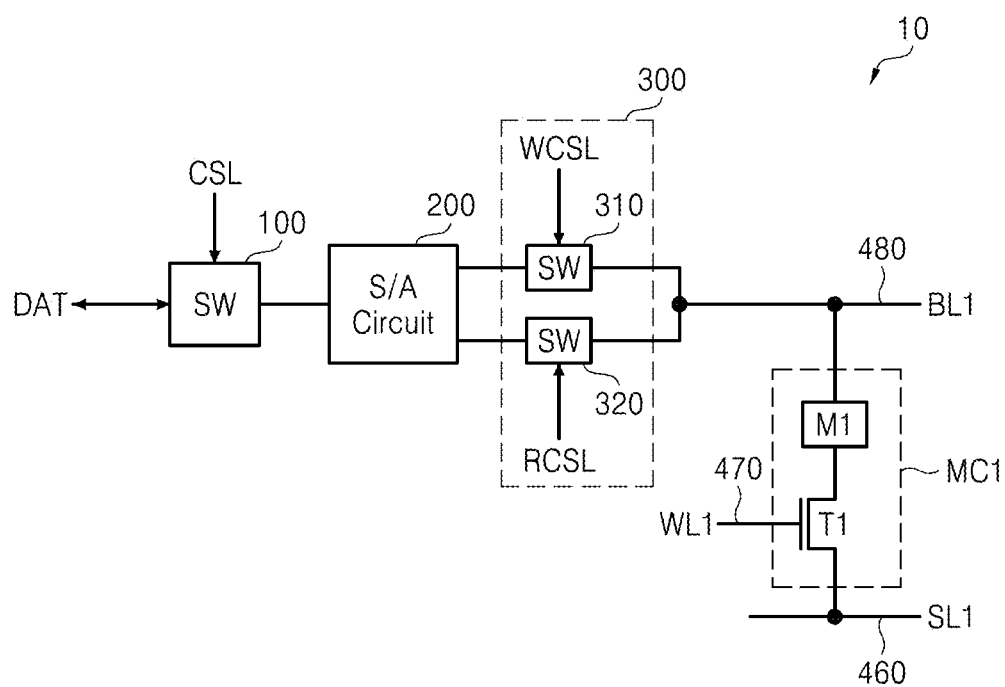
FIG. 1 is a diagram illustrating an operation of a memory cell according to an example embodiment of inventive concepts.

FIG. 1 is a diagram illustrating an operation of a memory cell according to an example embodiment of inventive concepts. FIG. 1 illustrates, for example, one memory cell MC1. The memory cell MC1 may be a magneto-resistive random access memory (MRAM) cell. However, example embodiments should not be limited to this example.

The memory cell MC1 includes a magnetic tunnel junction (MTJ) device M1 and a cell transistor T1. The MTJ device M1 and the cell transistor T1 are connected between a bit line BL1 and a source line SL1. A gate of the cell transistor T1 is connected to a word line WL1. In order to read data stored in the memory cell MC1, when the cell transistor T1 is selected by the word line WL1, a data value stored in the MTJ device M1 is transmitted to the bit line BL1. Data read by a read/write switching circuit 300 is transmitted to and amplified by a bit-line sense amplifier (S/A) circuit 200. The data amplified by the bit-line S/A circuit 200 may be transmitted to the outside when an input/output (I/O) switching circuit 100 is turned on.

The read/write switching circuit 300 may include a write switching circuit 310 and a read switching circuit 320.

During a data read operation, the read switching circuit 320 is turned on in response to a read column selection signal RCSL and data is input from the bit line BL1 to the bit-line S/A circuit 200.

Read data sensed and amplified by the bit-line S/A circuit 200 may be transmitted to the outside when the I/O switching circuit 100 is turned on in response to a main column selection signal CSL.

During a data write operation, data DAT provided from the outside is stored in the bit-line S/A circuit 200 by the I/O switching circuit 100, which is turned on in response to the main column selection signal CSL.

Write data stored in the bit-line S/A circuit 200 is transmitted to the bit line BL1 via the write switching circuit 310 when the write switching circuit 310 is turned on in response to a write column selection signal WCSL. A data value is stored in the MTJ device M1 according to the difference between voltages of the bit line BL1 and the source line SL1 coupled to opposite ends of the cell transistor T1 selected by the word line WL1 and the MTJ device M.

According to at least one example embodiment of inventive concepts, a data read path and a data write path may be different from each other. Thus, the read column selection signal RCSL for controlling the data read operation and the write column selection signal WCSL for controlling the data write operation have separate schemes.

Figure 2:
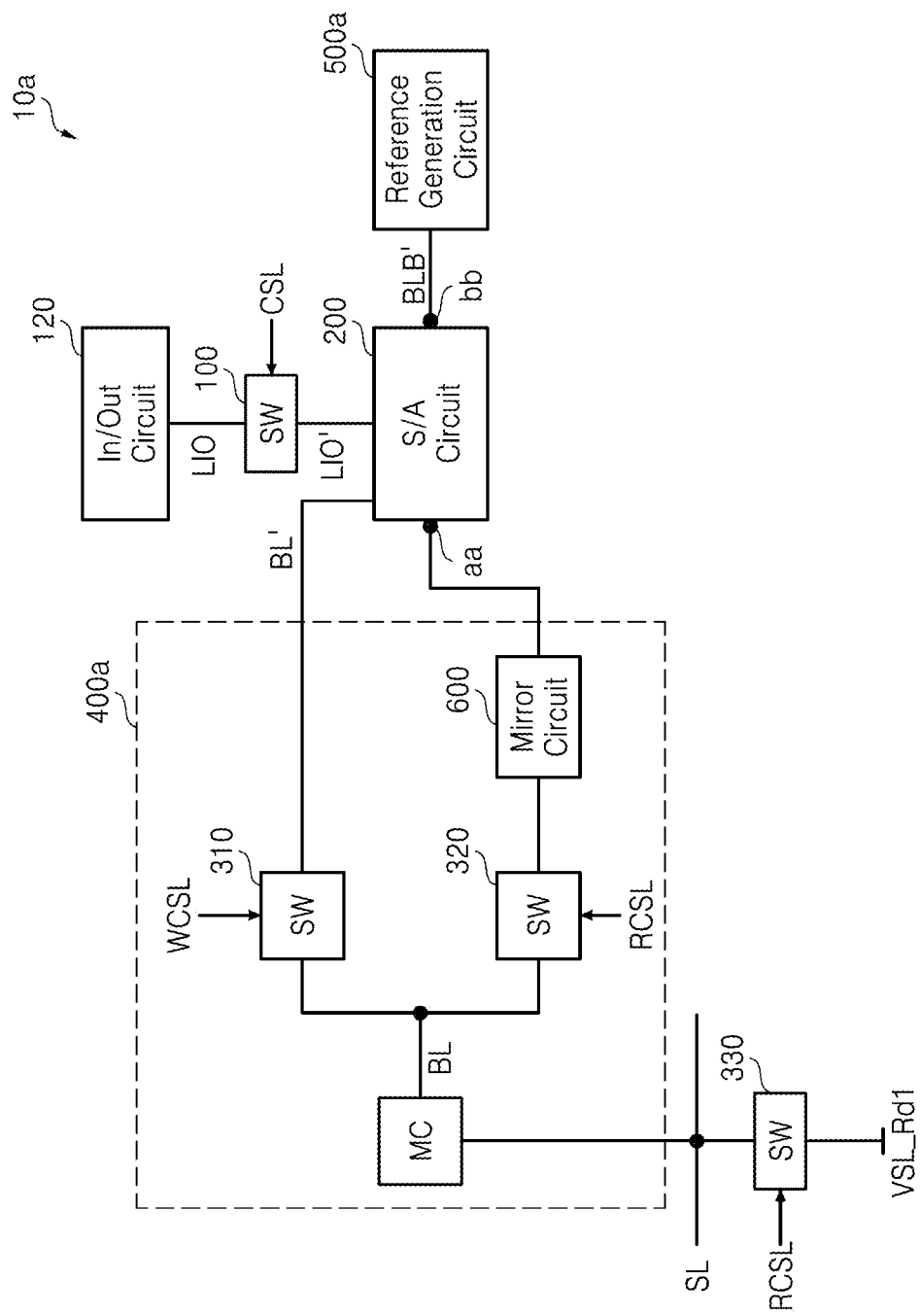
FIG. 2 is a block diagram of a memory device according to an example embodiment of inventive concepts.
Figure 3:
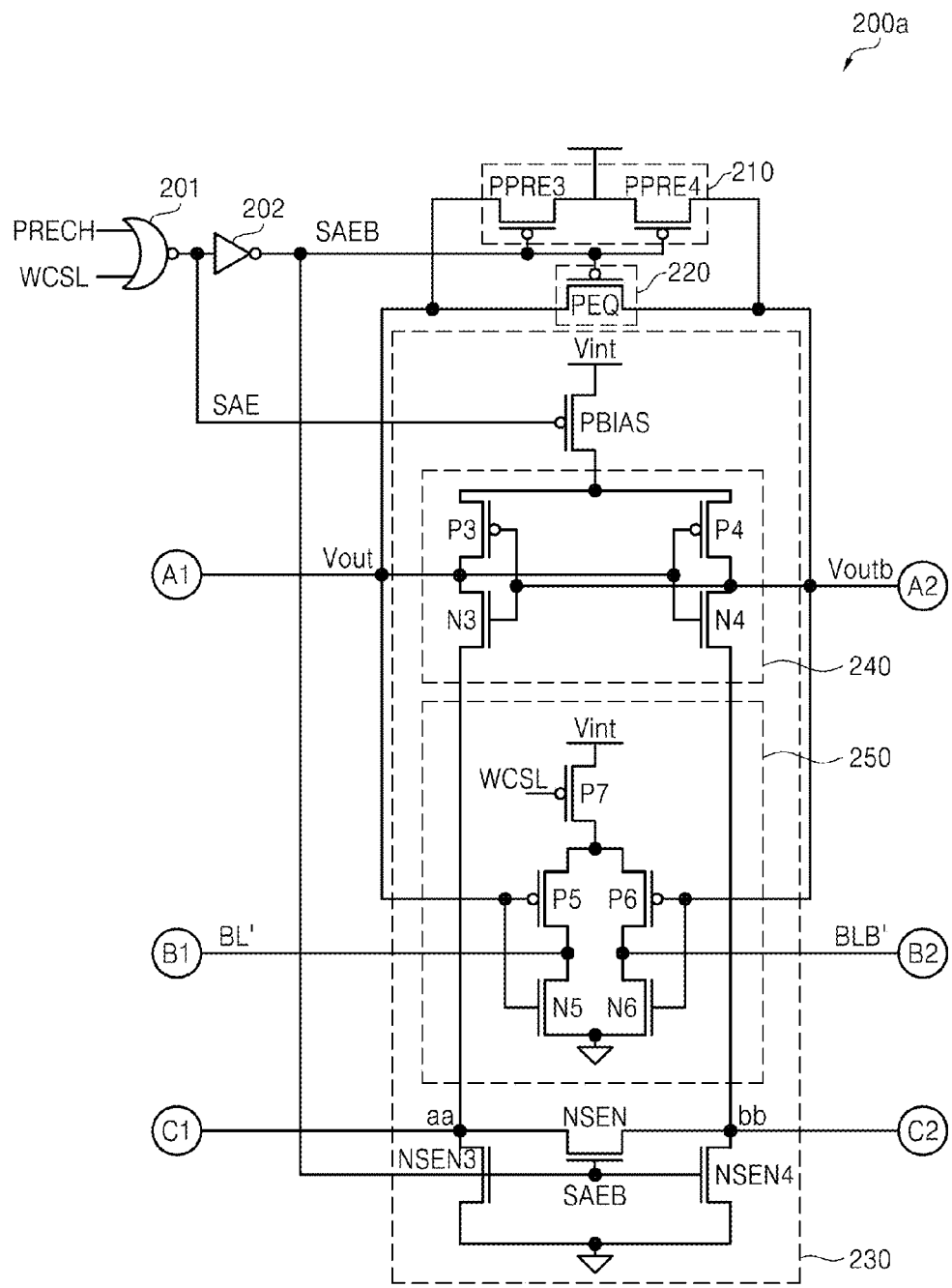
FIG. 3 is a circuit diagram of an example embodiment of the bit-line sense amplifier (S/A) circuit shown in FIG. 2.
Figure 4:
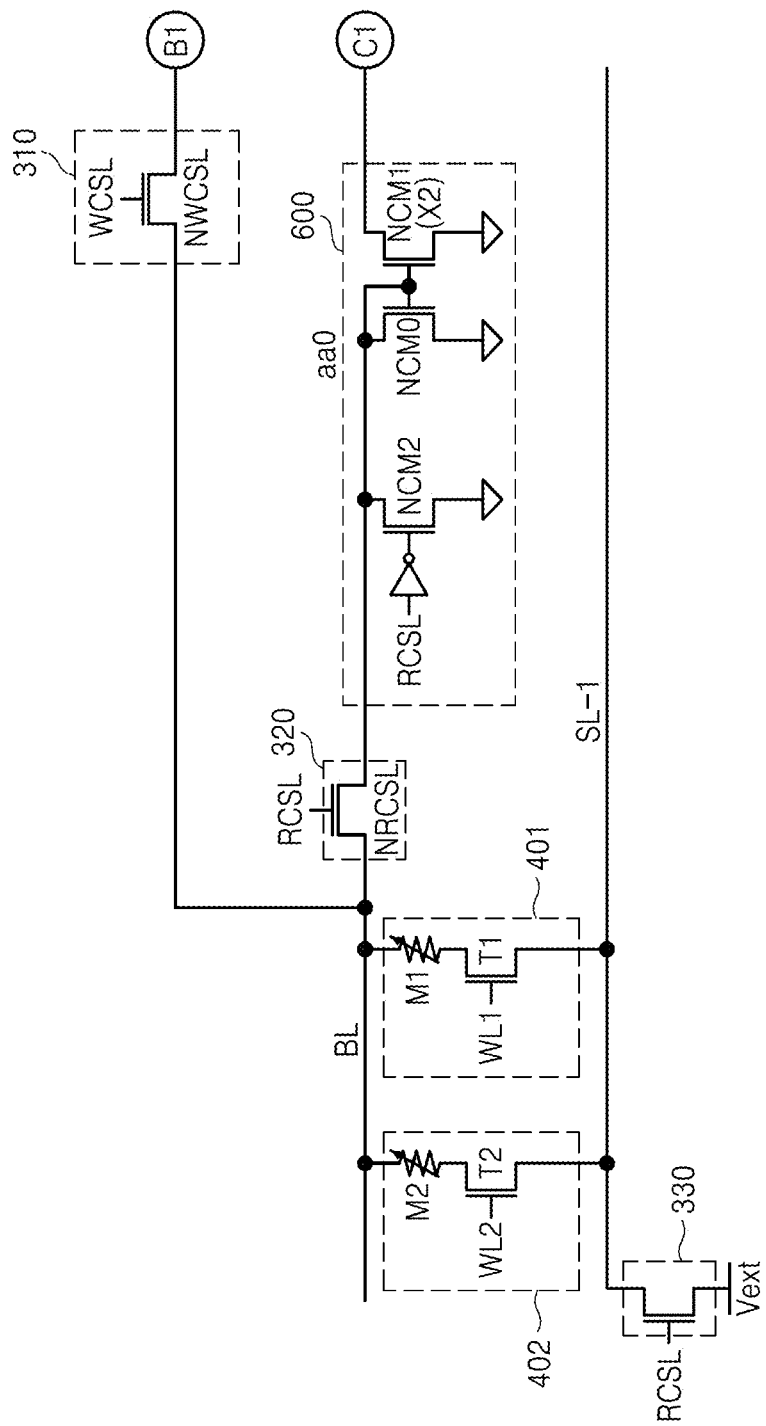
FIG. 4 is a circuit diagram of an example embodiment of the memory cell core circuit shown in FIG. 2.
Figure 5:
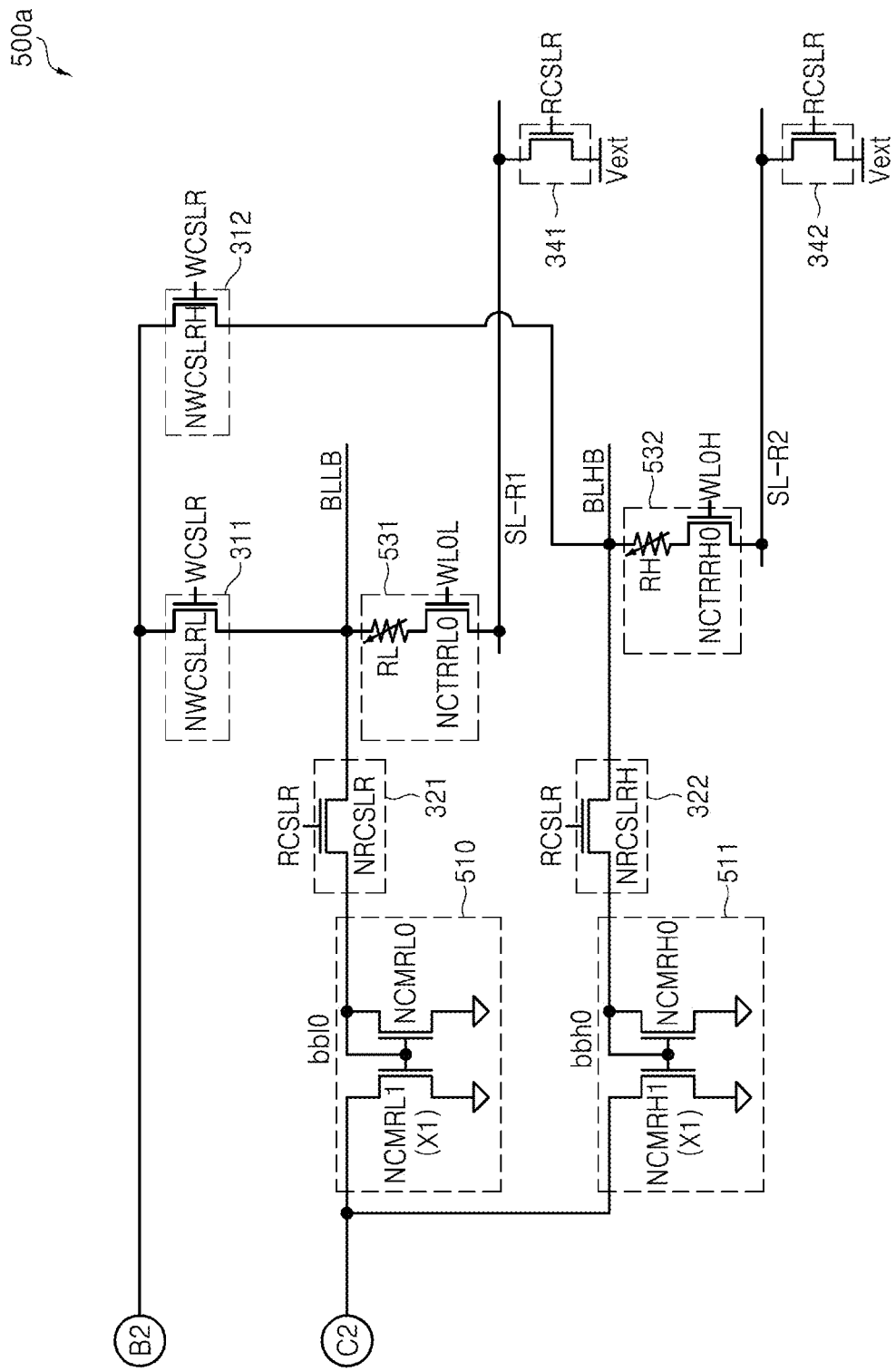
FIG. 5 is a circuit diagram of an example embodiment of the reference generation circuit shown in FIG. 2.
Figure 6A:
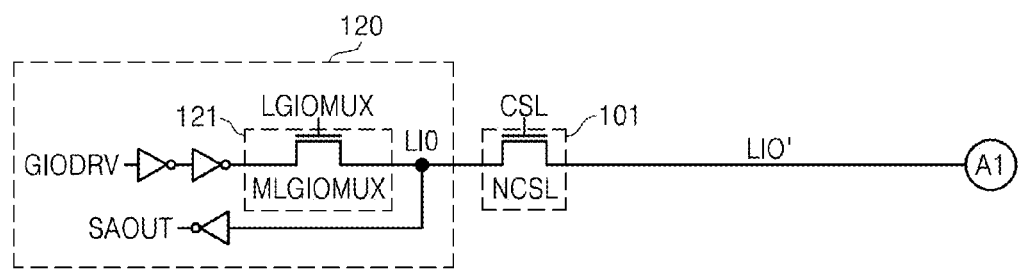
FIGS. 6A and 6B are circuit diagrams of an example embodiment of the input/output (I/O) circuit shown in FIG. 2.
Figure 6B:
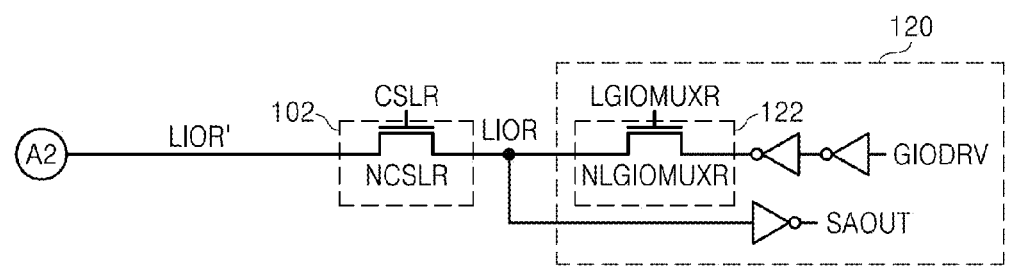

FIG. 2 is a schematic block diagram of a memory device according to an example embodiment of inventive concepts. FIG. 3 is a circuit diagram of a bit-line S/A circuit of FIG. 2 according to an example embodiment of inventive concepts. FIG. 4 is a circuit diagram of a memory cell core circuit of FIG. 2 according to an example embodiment of inventive concepts. FIG. 5 is a circuit diagram of a reference generation circuit of FIG. 2 according to an example embodiment of inventive concepts. FIGS. 6A and 6B are circuit diagrams of an input/output (I/O) circuit of FIG. 2 according to an example embodiment of inventive concepts.

Referring to FIGS. 2 to 6B, a memory device 10a includes a data I/O circuit 120, a bit-line S/A circuit 200, a source-line voltage supply circuit 330, a memory cell core circuit 400a, and a reference generation circuit 500. The reference generation circuit 500 may also be referred to as a reference current generation circuit.

The memory cell core circuit 400a may include a memory cell MC, a write switching circuit 310, a read switching circuit 320, and a mirror circuit 600, which are connected to a bit line BL.

As described above in detail with reference to FIG. 1, the memory cell MC may include a MTJ device M1 and a cell transistor T1 which are connected between a bit line BL and a source line SL.

The write switching circuit 310 operates in response to a write column selection signal WCSL. The write switching circuit 310 forms a data write path so that write data may be input to the memory cell MC via the bit-line S/A circuit 200.

The read switching circuit 320 operates in response to a read column selection signal RCSL. The read switching circuit 320 is located between the memory cell MC and the bit-line S/A circuit 200 to form a data read path.

The mirror circuit 600 mirrors current flowing through the memory cell MC.

The source-line voltage supply circuit 330 is coupled to the source line SL, and supplies a read source line voltage VSL_Rd1 to the source line SL during a data read operation.

According to at least one example embodiment of inventive concepts, the memory device 10a has a separate source line structure, in which source lines respectively corresponding to bit lines are separated from one another. The separate source line structure is different from a common source line structure in which source lines included in a memory cell array are commonly connected to be used as a common node, in that the source lines respectively correspond to the bit lines and may be separately controlled.

The source-line voltage supply circuit 330 continuously maintains a voltage of the source line SL1 to be equal or substantially equal to a read source line voltage VSL_Rd1 during the data read operation. In at least some example embodiments, the read source line voltage VSL_Rd1 may be set differently. For example, the read source line voltage VSL_Rd1 may be a ground voltage or a positive voltage, which is higher than the ground voltage.

The reference generation circuit 500 generates reference current.

Current (cell current) based on a data value of the memory cell MC may flow through a first node aa of the bit-line S/A circuit 200. The reference current generated by the reference generation circuit 500 may flow through a second node bb of the bit-line S/A circuit 200.

During the data read operation, the bit-line S/A circuit 200 performs current-sensing operation by comparing and amplifying the currents flowing through the first node aa and the second node bb (the cell current) based on the data value and the reference current.

The structure and operation of the bit-line S/A circuit 200 will be described in more detail with reference to FIG. 3 below.

Referring to FIG. 3, a bit-line S/A circuit 200a according to an example embodiment of inventive concepts includes a pre-charging circuit 210, an equalizing circuit 220, and a sensing and latch circuit 230.

The bit-line S/A circuit 200a is connected to the memory cell MC via a first line (an aa line) and is connected to a reference generation circuit 500a via a second line (a bb line) so as to read data from the memory cell MC. The reference generation circuit 500a may also be referred to herein as a reference current generation circuit. In at least one example embodiment, a line connecting a first node aa of the bit-line S/A circuit 200a and the cell core circuit (also referred to herein as the memory cell core) 400a is referred to as the first line (the aa line) and a line connecting the second node bb of the bit-line S/A circuit 200a and the reference generation circuit 500 is referred to as the second line (the bb line).

A line connecting an output node Vout of the bit-line S/A circuit 200a and the data I/O circuit 120 (e.g., a line LIO' of FIG. 6A) so that the bit-line S/A circuit 200a may receive data to be written to the memory cell MC is referred to as a third line. A line connecting a complementary output node Voutb of the bit-line S/A circuit 200a and the data I/O circuit 120 (e.g., a line LIOR' of FIG. 6B) is referred to as a complementary line of the third line.

The bit-line S/A circuit 200a is connected to the memory cell MC via a fourth line BL' so as to write data to the memory cell MC.

The bit-line S/A circuit 200a operates based on a pre-charge signal PRECH and the write column selection signal WCSL.

A NOR device 201 may perform a NOR operation on the pre-charge signal PRECH and the write column selection signal WCSL to generate a sensing enable signal SAE. An inverter 202 may invert the sensing enable signal SAE to generate a complementary sensing enable signal SAEB.

The pre-charging circuit 210 includes two PMOS transistors PPRE3 and PPRE4, and is activated by the complementary sensing enable signal SAEB supplied to gates of the two transistors PPRE3 and PPRE4. The pre-charging circuit 210 applies a pre-charge voltage or current by being connected to the output node Vout and the complementary output node Voutb.

The equalizing circuit 220 equalizes voltages of the output node Vout and the complementary output node Voutb. In at least one example embodiment, the equalizing circuit 220 may include one PMOS transistor PEQ. The PMOS transistor PEQ is activated by the complementary sensing enable signal SAEB.

The sensing and latch circuit 230 includes a cross-coupled latch 240 and a write latch 250. The cross-coupled latch 240 includes cross-coupled positive feedback inverters. For example, in the cross-coupled latch 240, an inverter having transistors P3 and N3 and an inverter having transistors P4 and N4 are connected in a cross-coupled configuration. The output node Vout is located between the transistors P3 and N3. The complementary output node Voutb is located between the transistors P4 and N4.

The output node Vout and the complementary output node Voutb are coupled to an input node of the write latch 250.

A bias transistor PBIAS may be provided between the cross-coupled latch 240 and a power source Vint. The bias transistor PBIAS is activated by the sensing enable signal SAE.

The write latch 250 may include PMOS transistors P5, P6, and P7 and NMOS transistors N5 and N6. An input node of an inverter having the PMOS transistor P5 and the NMOS transistor N5 is commonly connected to the output node Vout, and an output node thereof is connected to the fourth line BL'. An input node of an inverter having the PMOS transistor P6 and the NMOS transistor N6 is connected to the complementary output node Voutb, and an output node thereof is connected to a complementary line BLB' of the fourth line BL'.

One end of the PMOS transistor P5 and one end of the PMOS transistor P6 are commonly connected to the PMOS transistor P7, and are connected to the power source Vint via the PMOS transistor P7. The PMOS transistor P7 operates in response to the write column selection signal WCSL.

One end of the NMOS transistor N5 and one end of the NMOS transistor N6 are commonly connected to the ground.

The write latch 250 is deactivated in a data read operation and is activated in a data write operation.

The sensing and latch circuit 230 further includes an NMOS transistor NSEN connected between the first node aa and the second node bb, an NMOS transistor NSEN3 connected to the first node aa and the ground, and an NMOS transistor NSEN4 connected between the second node bb and the ground. The NMOS transistors NSEN, NSEN3, and NSEN4 may operate in response to the complementary sensing enable signal SAEB.

The NMOS transistor NSEN connected between the first node aa and the second node bb equalizes voltages of the first node aa and the second node bb.

The first node aa is connected to one end of the NMOS transistor N3 of the cross-coupled latch 240. The second node bb is connected to one end of the NMOS transistor N4 of the cross-coupled latch 240.

During the data read operation, cell current based on a data value of the memory cell MC may flow through the first node aa, and reference current may flow through the second node bb.

Thus, during the data read operation, the sensing and latch circuit 230 performs a current-sensing operation by comparing and amplifying the currents flowing through the first node aa and the second node bb.

During the data read operation, the write latch 250 of the sensing and latch circuit 230 is deactivated. During the data read operation, the sensing and latch circuit 230 compares and amplifies the cell current and the reference current respectively flowing through the first node aa and the second node bb, and an amplified signal may be output via the output node Vout.

During a data write operation, the sensing and latch circuit 230 latches write data input to the output node Vout by using the cross-coupled latch 240, and operates in a voltage mode.

During the data write operation, the write latch 250 of the sensing and latch circuit 230 is also activated. Thus, the write data input to the output node Vout is also input to the write latch 250. A voltage of the fourth line BL' connected to the write latch 250 is determined by a value of the write data. The fourth line BL' is connected to the bit line BL via the write switching circuit 310.

A value and direction of current flowing through the memory cell MC is determined by the difference between voltages of the bit line BL and the source line SL, and thus a data value corresponding to the memory cell MC is stored.

The output node Vout and the complementary output node Voutb of the bit-line S/A circuit 200a are connected to the data I/O circuit 120 via the I/O switching circuit 100.

One of output nodes of the write latch 250 of the bit-line S/A circuit 200a may be connected to the memory cell MC via the fourth line BL' and the write switching circuit 310, and another node thereof may be connected to the reference generation circuit 500 via the complementary line BLB' of the fourth line BL'.

The first node aa of the bit-line S/A circuit 200 may be connected to the memory cell core circuit 400a via the first line (the aa line), and the second node bb thereof may be connected to the reference generation circuit 500 via the second line (the bb line).

Referring to FIG. 4, a memory cell core circuit 400a includes at least one memory cell (e.g., memory cells 401 and 402) connected between a bit line BL and a source line SL-1, a write switching circuit 310, a read switching circuit 320, and a mirror circuit 600.

As described above with reference to FIGS. 1 and 2, the memory cell 401 includes a MTJ device M1 and a cell transistor T1 connected between the bit line BL and the source line SL-1, and the memory cell 402 includes a MTJ device M2 and a cell transistor T2 connected between the bit line BL and the source line SL-1.

The write switching circuit 310 may be embodied as an NMOS transistor NWCSL turned on/off in response to the write column selection signal WCSL, but is not limited thereto. Similarly, the read switching circuit 320 may be embodied as an NMOS transistor NRCSL turned on/off in response to the read column selection signal RCSL, but is not limited thereto.

The source-line voltage supply circuit 330 may be embodied as a source line switch 330, which is connected between the source line SL-1 and an external power supply voltage Vext source, and which operates in response to the read column selection signal RCSL.

The source line switch 330 may be embodied as an NMOS transistor, but is not limited thereto. For example, the source line switch 330 may be a PMOS transistor or a combination of a PMOS transistor and an NMOS transistor.

During a data read operation, the source line switch 330 may make a voltage of the source line SL-1 equal to an external power supply voltage Vext. The external power supply voltage Vext may be a positive voltage which is greater than '0'.

In at least one example embodiment, the mirror circuit 600 may include an NMOS transistor NCM0 and an NMOS transistor NCM1, which is double the size of the NMOS transistor NCM0. The NMOS transistor NCM0 may be connected between one node aa0 of the read switching circuit 320 and the ground. The NMOS transistor NCM1 may be connected between the first node aa of the bit-line S/A circuit 200 and the ground.

A gate of the NMOS transistor NCM0 and a gate of the NMOS transistor NCM1 are commonly connected to the node aa0 of the read switching circuit 320.

Thus, the mirror circuit 600 may mirror current flowing through the memory cell 401 or 402 in a scale of 1:2, but example embodiments of inventive concepts are not limited thereto.

The mirror circuit 600 may further include an NMOS transistor NCM2 connected between the node aa0 of the read switching circuit 320 and the ground. The NMOS transistor NCM2 operates in response to the read column selection signal RCSL.

Thus, during the data read operation, when the read column selection signal RCSL is activated, the NMOS transistor NCM2 is turned off and only the NMOS transistor NCM0 and the NMOS transistor NCM1 operate.

While the read column selection signal RCSL is deactivated, the NMOS transistor NCM2 is turned on to connect the node aa0 to the ground.

In at least one example embodiment, at least one switching device (not shown) may be further provided between the read switching circuit 320 and the memory cells 401 and 402.

Referring to FIG. 5, the reference generation circuit 500 may include a first reference memory cell 531, a second reference memory cell 532, a plurality of switching circuits 311, 312, 321, and 322, and first and second mirror circuits 510 and 520.

The first reference memory cell 531 may store a data value of 0 and the second reference memory cell 532 may store a data value of 1.

The first reference memory cell 531 includes an MTJ device RL and a cell transistor NCTRRL0 connected between a first complementary bit line BLLB and a source line SL-R1. The second reference memory cell 532 includes a MTJ device RH and a cell transistor NCTRRH0 connected between a second complementary bit line BLHB and a source line SL-R2.

The first write switching circuit 311 operates in response to a reference write selection signal WCSLR. The first write switching circuit 311 forms a write path of the first reference data, e.g., '0', such that the first reference data is input to the first reference memory cell 531 by the bit-line S/A circuit 200.

Similarly, the second write switching circuit 312 operates in response to the reference write selection signal WCSLR. The second write switching circuit 312 forms a write path of second reference data, e.g., '1', such that the second reference data is input to the second reference memory cell 532 by the bit-line S/A circuit 200. The first and second write switching circuits 311 and 312 may be embodied respectively as NMOS transistors NWCSLRL and NWCSLRH turned on/off in response to the reference write selection signal WCSLR, but are not limited thereto. The reference write selection signal WCSLR may be the same as or different from the write column selection signal WCSL.

The first read switching circuit 321 operates in response to a reference read selection signal RCSLR. The first read switching circuit 321 is located between the first reference memory cell 531 and the bit-line S/A circuit 200 to form a read path of the first reference data.

Similarly, the second read switching circuit 322 operates in response to the reference read selection signal RCSLR. The second read switching circuit 322 is located between the second reference memory cell 532 and the bit-line S/A circuit 200 to form a read path of the second reference data. The first and second read switching circuits 321 and 322 may be embodied respectively as NMOS transistors NRCSLRL and NRCSLRH turned on/off in response to the reference read selection signal RCSLR, but are not limited thereto. The reference read selection signal RCSLR may be the same as or different from the read column selection signal RCSL.

The first mirror circuit 510 mirrors current flowing through the first reference memory cell 531. The first mirror circuit 510 may include two NMOS transistors NCMRL0 and NCMRL1, which are the same or substantially the same in size. The NMOS transistor NCMRL0 may be connected between one node bbl0 of the first read switching circuit 321 and the ground. The NMOS transistor NCMRL1 may be connected between the second node bb of the bit-line S/A circuit 200 and the ground.

A gate of the NMOS transistor NCMRL0 and a gate of the NMOS transistor NCMRL1 are commonly connected to the node bbl0 of the first read switching circuit 321.

Thus, the first mirror circuit 510 may mirror current (e.g., first reference current) flowing through the first reference memory cell 531 in a scale of 1:1, but example embodiments of inventive concepts are not limited thereto.

The second mirror circuit 511 mirrors current flowing through the second reference memory cell 532, and has a structure similar to that of the first mirror circuit 510. The second mirror circuit 511 may include two NMOS transistors NCMRH0 and NCMRH1 having the same or substantially the same size. The NMOS transistor NCMRH0 may be connected between one node bbh0 of the second read switching circuit 322 and the ground. The NMOS transistor NCMRH1 may be connected between the second node bb of the bit-line S/A circuit 200 and the ground.

A gate of the NMOS transistor NCMRH0 and a gate of the NMOS transistor NCMRH1 are commonly connected to the node bbh0 of the second read switching circuit 322.

Thus, the second mirror circuit 511 may mirror current (e.g., second reference current) flowing through the second reference memory cell 532 in a scale of 1:1, but example embodiments of inventive concepts are not limited thereto.

Reference current based on the first reference current and the second reference current may flow through the second node bb of the bit-line S/A circuit 200a by the first and second mirror circuits 510 and 511. For example, reference current generated by the reference generation circuit 500a may be the sum of the first reference current and the second reference current.

Similar to the mirror circuit 600 of FIG. 4, each of the first and second mirror circuits 510 and 511 may be connected between the node bbl0 or bbh0 and the ground, and may further include an NMOS transistor (not shown) turned on/off in response to the reference read selection signal RCSLR.

According to at least one example embodiment of inventive concepts, the memory device 10a may further include reference-cell source line switches 341 and 342 respectively connected to source lines SL-R1 and SL-R2 of the respective reference memory cells 531 and 532.

The reference-cell source line switches 341 and 342 may be embodied as NMOS transistors, but are not limited thereto.

For example, the first reference-cell source line switch 341 may be connected between the source line SL-R1 of the first reference memory cell 531 and the external power supply voltage Vext source, and operate in response to the reference read selection signal RCSLR. The second reference-cell source line switch 342 may be connected between the source line SL-R2 of the second reference memory cell 532 and the external power supply voltage Vext source, and operate in response to the reference read selection signal RCSLR.

During a data read operation, the first and second reference-cell source line switches 341 and 342 respectively fix a voltage of the source line SL-R1 of the first reference memory cell 531 and a voltage of the source line SL-R2 of the second reference memory cell 532 to the external power supply voltage Vext.

Referring to FIG. 6A, during a data write operation, data to be written (write data) is input via a GIO driver GIODRV. The GIO driver GIODRV is connected to an L-switch 121. The L-switch 121 which may include an NMOS transistor MLGIOMUX operates in response to an LGIOMUX signal. The L-switch 121 may be connected to a first I/O switch 101 of the I/O switching circuit 100. The first I/O switch 101 operates in response to a main column selection signal CSL. The first I/O switch 101 may be connected to the output node Vout of the bit-line S/A circuit 200 via a third line LIO'.

When reference data is to be written, a path of FIG. 6B may be used.

For example, the reference data is input via the GIO driver GIODRVR and the GIO driver GIODRVR is connected to an R-switch 122. The R-switch 122 which may include an NMOS transistor MLGIOMUXR operates in response to an LGIOMUXR signal. The R-switch 122 may be connected to a second I/O switch 102 of the I/O switching circuit 100. The second I/O switch 102 operates in response to the main column selection signal CSLR. The second I/O switch 102 may be connected to the complementary output node Voutb of the bit-line S/A circuit 200 via a complementary line LIOR' of the third line LIO'.

During a data read operation, all the I/O circuits and the switches of FIGS. 6A and 6B may be used. For example, read data output from the output node Vout of the bit-line S/A circuit 200 may be output as a sense amplifier output signal SAOUT from the first I/O switch 101 of the I/O switching circuit 100 via the third line LIO'. Complementary read data output from the complementary output node Voutb of the bit-line S/A circuit 200 via the complementary line LIOR' of the third line LIO' may be output as a complementary sense amplifier output signal SAOUTB via the second I/O switch 102 of the I/O switching circuit 100.

Figure 7:
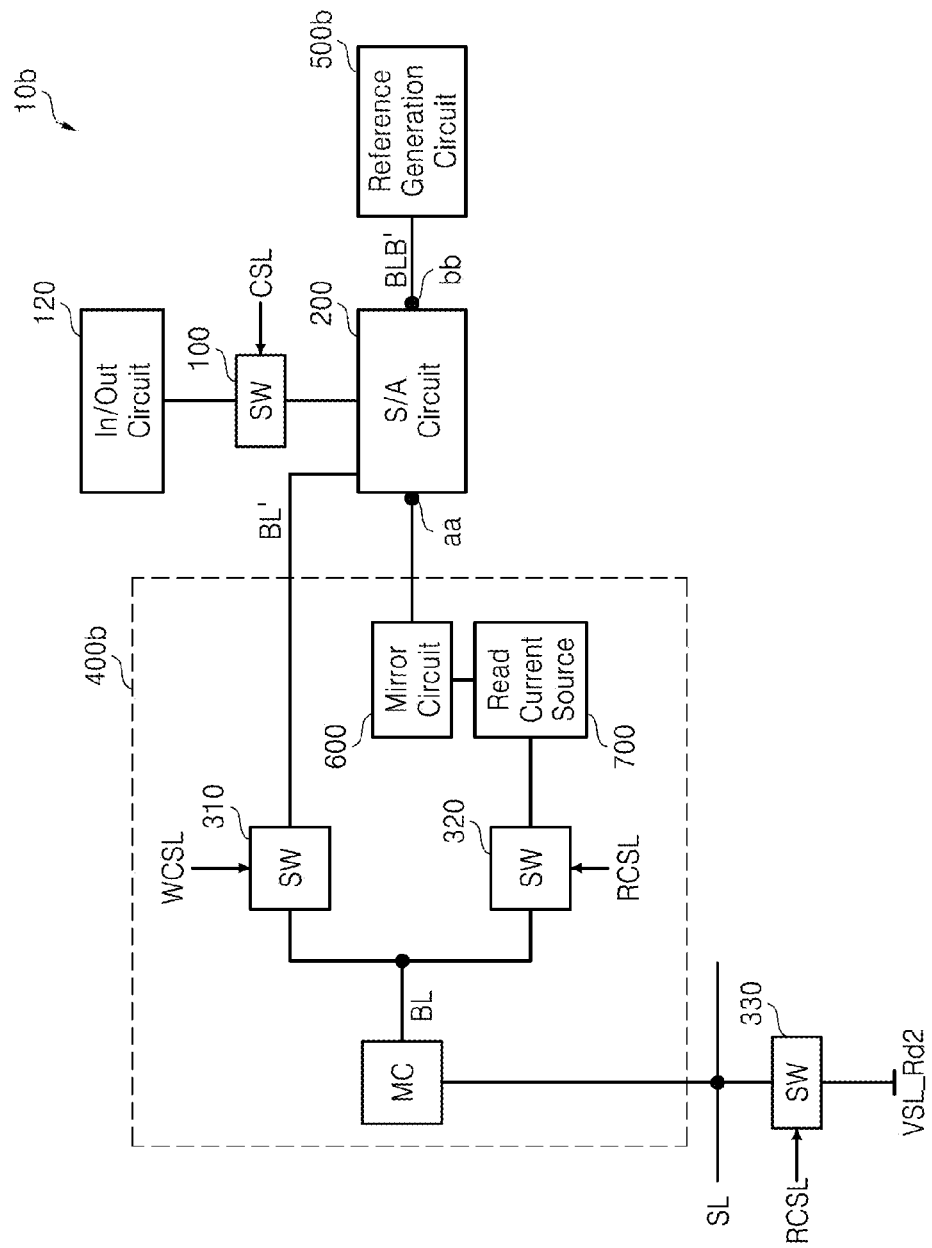
FIG. 7 is a block diagram of a memory device according to another example embodiment of inventive concepts.
Figure 8:
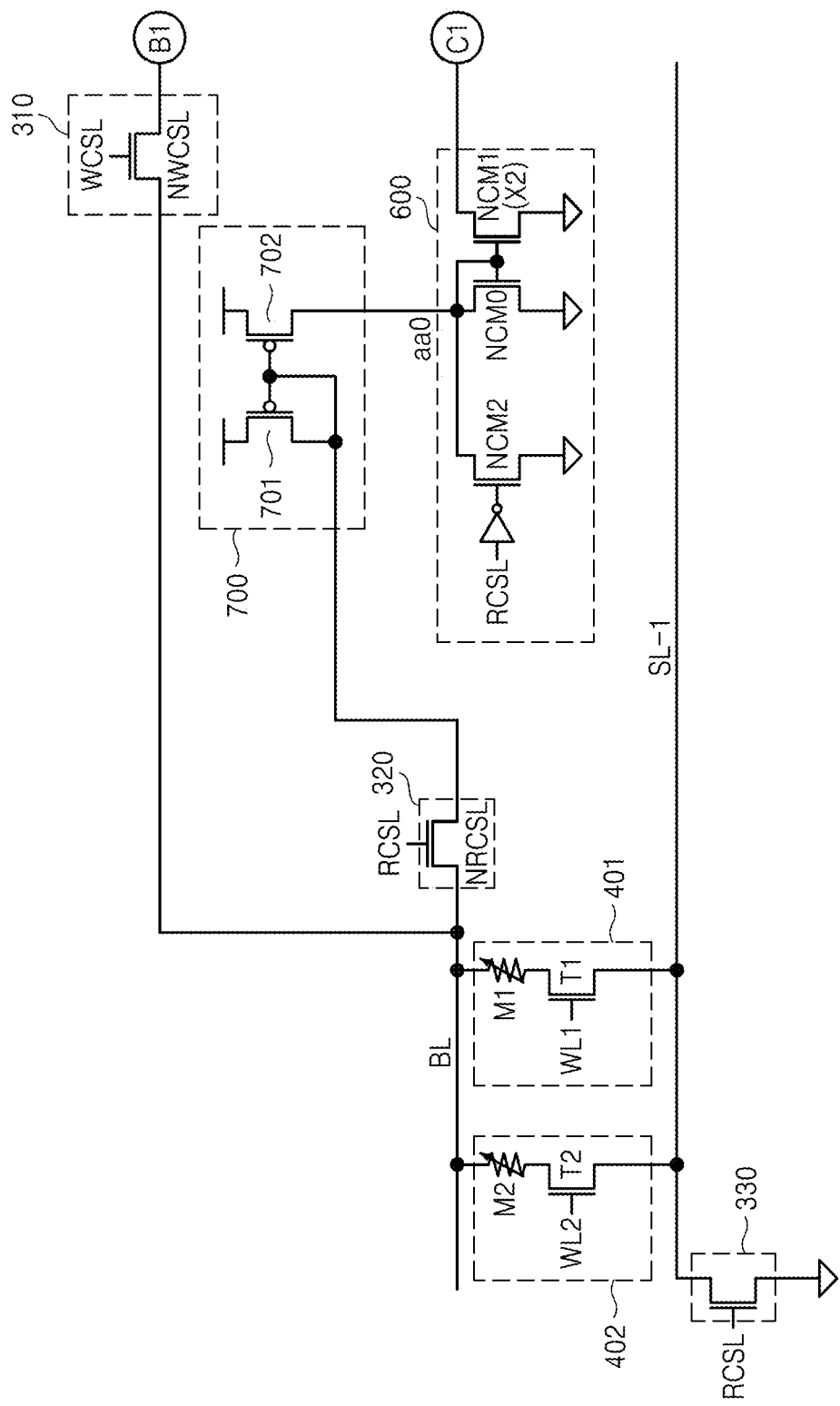
FIG. 8 is a circuit diagram of a memory cell core circuit of FIG. 7 according to another example embodiment of inventive concepts.
Figure 9:
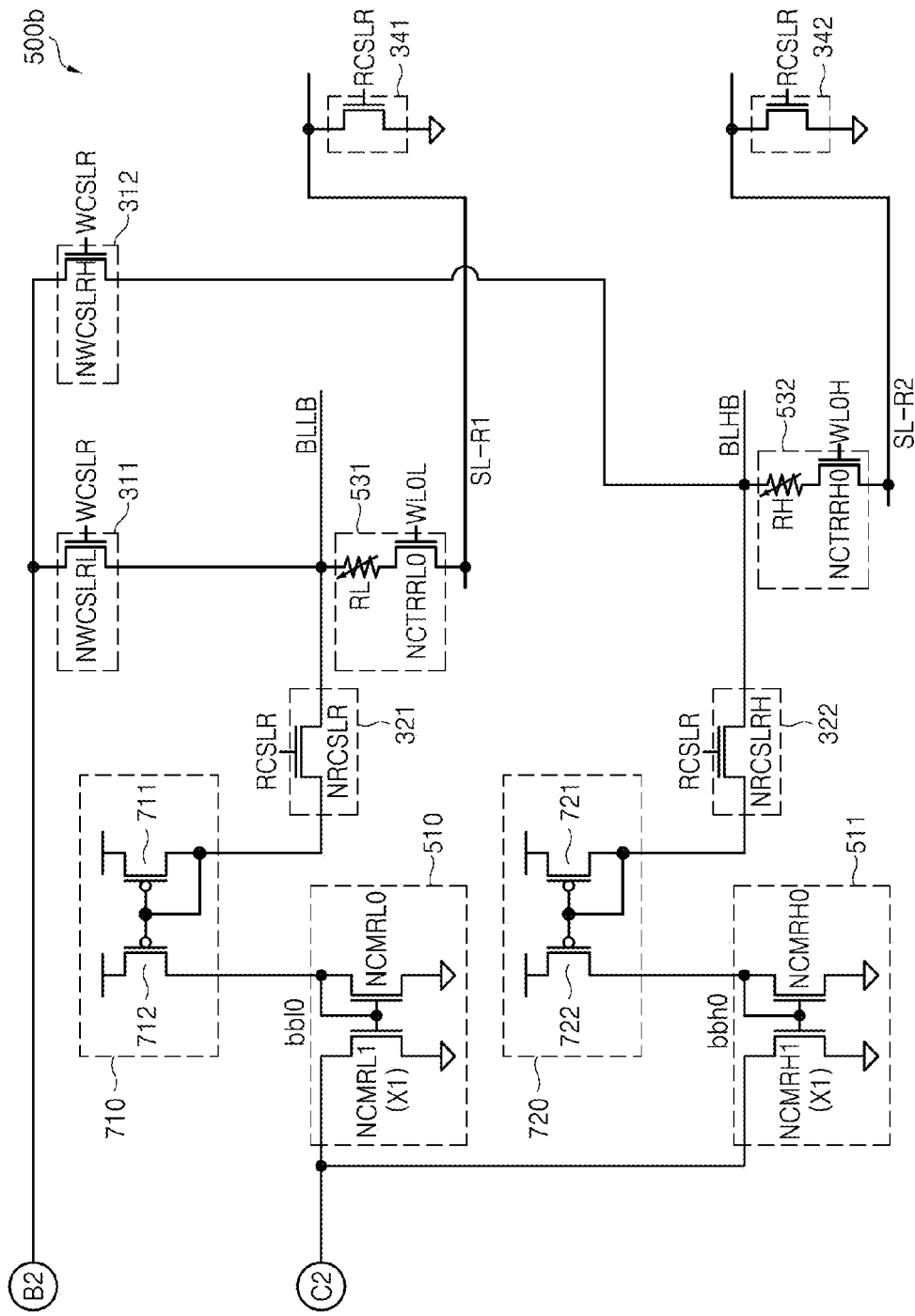
FIG. 9 is a circuit diagram of an example embodiment of the reference generation circuit shown in FIG. 7.

FIG. 7 is a schematic block diagram of a memory device according to another example embodiment of inventive concepts. FIG. 8 is a circuit diagram of a memory cell core circuit of FIG. 7 according to another example embodiment of inventive concepts. FIG. 9 is a circuit diagram of a reference generation circuit of FIG. 7 according to another example embodiment of inventive concepts.

Referring to FIGS. 7 to 9, a memory device 10b includes a data I/O circuit 120, a bit-line S/A circuit 200, a source-line voltage supply circuit 330, a memory cell core circuit 400b, and a reference generation circuit 500b. The reference generation circuit 500b may also be referred to as a reference current generation circuit.

The memory device 10b of FIG. 7 is substantially the same as the memory device 10a of FIG. 2 in structure and operation and will be thus described focusing on the differences from the memory device 10a to avoid redundant description.

The memory device 10b is largely different from the memory device 10a in terms of the memory cell core circuit 400b and the reference generation circuit 500b.

Referring to FIG. 8, the memory cell core circuit 400b may further include a first read-current source 700, compared to the memory cell core circuit 400a of FIG. 2.

The first read-current source 700 is connected to a bit line BL via a read switching circuit 320 to cause read current to flow from the bit line BL to a source line SL-1 via a memory cell MC.

The first read-current source 700 may include two PMOS transistors 701 and 702 which constitute a current mirror circuit.

The PMOS transistor 701 is connected to a power supply voltage source and one end of the read switching circuit 320. The PMOS transistor 702 is connected to the power supply voltage source and one node aa0 of a mirror circuit 600. Gates of the two PMOS transistors 701 and 702 are commonly connected to one end of the read switching circuit 320.

The source-line voltage supply circuit 330 may connect a source line SL to the ground during a data read operation. For example, a read source line voltage VSL_Rd2 may be a ground voltage.

Thus, during the data read operation, the source line SL-1 is pre-charged to the ground voltage and thus read current supplied from the first read-current source 700 flows from the bit line BL to the source line SL-1.

That is, for example, the first read-current source 700 causes the read current to flow from the bit line BL to the source line SL only during the data read operation, thereby forming the flow of current to read data.

A read-current source, which supplies read current to read reference data, may be provided, similar to the first read-current source 700, which supplies read current to read normal data. That is, for example, the reference generation circuit 500*b* may include at least one read-current source similar to the first read-current source 700.

Referring to FIG. 9, a reference generation circuit 500*b* is substantially the same as the reference generation circuit 500*a* of FIG. 5 in structure and operation and will be thus described focusing on the differences from the reference generation circuit 500*a* to avoid redundant description.

The reference generation circuit 500*b* further includes second and third read-current sources 710 and 720, compared to the reference generation circuit 500*a*.

The second read-current source 710 may include two PMOS transistors 711 and 712, which constitute a current mirror circuit.

The PMOS transistor 711 is connected between the power supply voltage source and one end of the first read switching circuit 321. The PMOS transistor 702 is connected between the power supply voltage source and one node bbl0 of the first mirror circuit 510. Gates of the two PMOS transistors 711 and 712 are commonly connected to one end of the first read switching circuit 321.

A first reference-cell source line switch 341 fixes a source line SL-R1 to the ground voltage during the data read operation. Thus, during the data read, the source line SL-R1 is fixed to the ground and thus read current supplied from the second read-current source 710 flows from a bit line BLLB to the source line SL-R1.

The third read-current source 720 may include two PMOS transistors 721 and 722, which constitute a current mirror circuit.

The PMOS transistor 721 is connected between the power supply voltage source and one end of a second read switching circuit 322. The PMOS transistor 722 is connected between the power supply voltage and one node bbh0 of the second mirror circuit 511. Gates of the two PMOS transistors 721 and 722 are commonly connected to one end of the second read switching circuit 322.

A second reference-cell source line switch 342 fixes a source line SL-R2 to the ground voltage during the data read operation. Thus, during the data read operation, the source line SL-R2 is fixed to the ground, and thus, read current supplied from the third read-current source 720 flows from a bit line BLHB to the source line SL-R12.

According to at least one example embodiment of inventive concepts, in the semiconductor devices 10, 10*a*, and 10*b* each having the separate source line structure, a voltage of each source line may be set to a desired voltage by the source-line voltage supply circuit 330. Thus, a current path may be formed using a relatively low voltage, and a direction of current may be easily set to a direction from a bit line to a source line or a direction from the source line to the bit line.

Accordingly, according to an example embodiment of inventive concepts, the semiconductor devices 10, 10*a*, and 10*b* may operate with a relatively low voltage (e.g., a low voltage).

Figure 10:
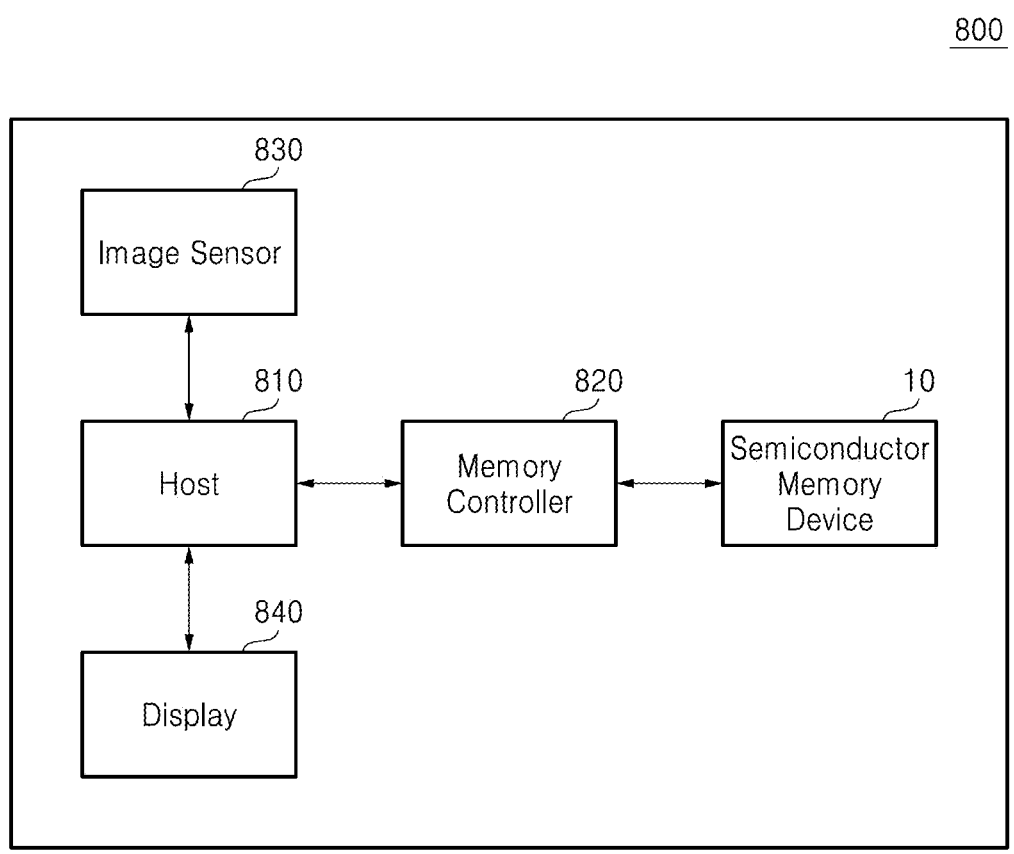
FIG. 10 is a block diagram of a memory system including a memory device according to one or more example embodiments of inventive concepts.

FIG. 10 is a block diagram of a memory system 800 including a memory device 10 according to one or more example embodiments of inventive concepts. The memory system 800 may be implemented as an image processing device like a digital camera, a cellular phone equipped with a digital camera, or a smart phone equipped with a digital camera.

The memory system 800 includes a host 810, the memory device 10 and a memory controller 820 controlling the data processing operations, such as a write operation or a read operation, of the memory device 10. The memory system 800 further includes an image sensor 830 and a display 840.

The memory device 10 may be one of the memory devices 10, 10*a*, and 10*b* illustrated in FIGS. 1, 2 and 7.

The image sensor 830 included in the memory system 800 converts optical images into digital signals and outputs the digital signals to the host 810 or the memory controller 820. The digital signals may be controlled by the host 810 to be displayed through the display 840 or stored in the memory device 10 through the memory controller 820.

Data stored in the memory device 10 may be displayed through the display 840 according to the control of the host 810 or the memory controller 820. The memory controller 820, which may control the operations of the memory device 10, may be implemented as a part of the host 810 or as a separate chip.

Figure 11:
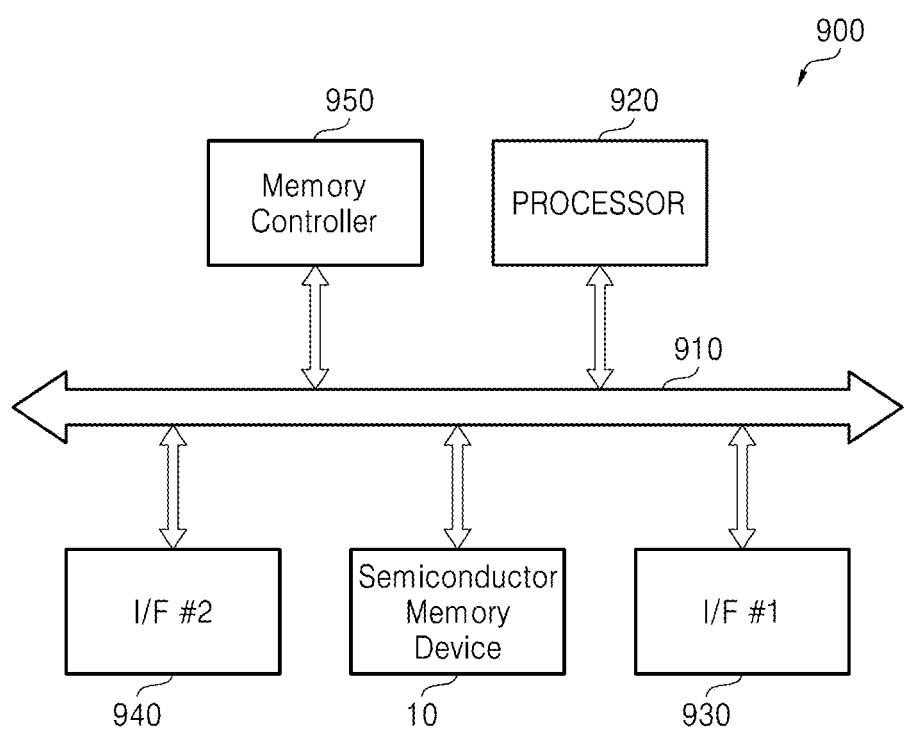
FIG. 11 is a block diagram of a memory system including a memory device according to one or more example embodiments of inventive concepts.

FIG. 11 is a block diagram of a memory system 900 including a memory device 10 according to one or more example embodiments of inventive concepts. The memory system 900 may include the memory device 10, a memory controller 950, a processor 920 a first interface 930 and a second interface 940, which are connected to a data bus 910.

According to one or more example embodiments, the memory system 900 may include a portable device such as a mobile phone, MP3 (MPECG Audio Layer-3) player, or MP4 (MPECG Audio Layer-4) player, a personal digital assistant (PDA), or a portable media player (PMP).

According to one or more example embodiments, the memory system 900 may include a data processing system such as a personal computer (PC), a notebook-sized personal computer or a laptop computer.

According to one or more example embodiments, the memory system 900 may include a memory card such as a secure digital (SD) card or a multimedia card (MMC).

According to one or more example embodiments, the memory system 900 may include a smart card or a solid state drive (SSD).

The memory device 10, the memory controller 950 and the processor may be implemented as one chip, for example, a system on chip (SoC) or as separate devices.

According to one or more example embodiments, the processor 920 may process data input through the first interface 930 and write the data in the semiconductor memory device 10.

According to one or more example embodiments, the processor 920 may read data from the semiconductor memory device 10 and output the data through the first interface 930. In this case, the first interface 930 may be an input/output device.

The second interface 940 may be a wireless interface for wireless communication.

According to one or more example embodiments, the second interface 940 may be implemented by software, firmware or a combination of software and firmware.

Figure 12:
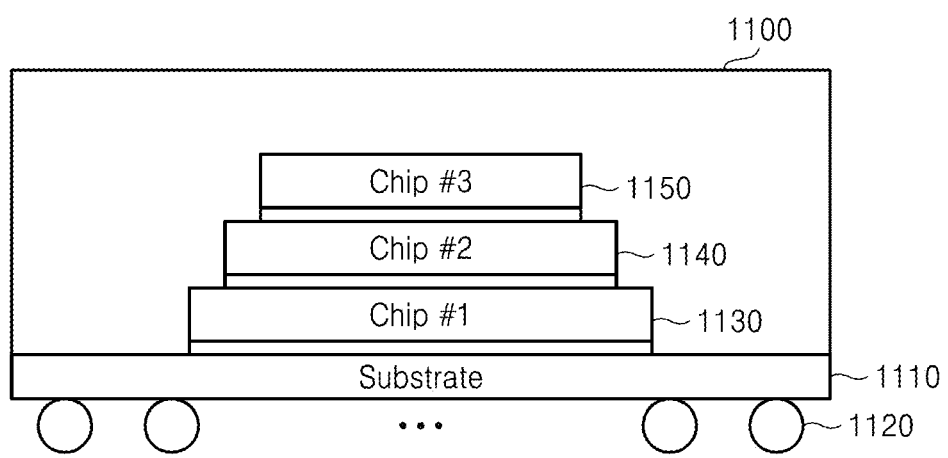
FIG. 12 is a schematic conceptual diagram of a multi-chip package including a memory device according to one or more example embodiments of inventive concepts.

FIG. 12 is a schematic conceptual diagram of a multi-chip package 1100 including a memory device 10 according to one or more example embodiments of inventive concepts. Referring to FIG. 12, the multi-chip package 1100 may include a plurality of semiconductor devices (e.g., first through third chips 1130, 1140, and 1150), which are sequentially stacked on a package substrate 1110. All or some of the plurality of semiconductor devices 1130 through 1150 may constitute one of the memory devices 10, 10*a*, and 10*b* illustrated in FIGS. 1, 2 and 7. A memory controller (not shown) for controlling the operations of the semiconductor devices 1130 through 1150 may be included within at least one of the semiconductor devices 1130 through 1150 or may be implemented on the package substrate 1110. A through-silicon via (TSV) (not shown), a bonding wire (not shown), a bump (not shown), or a solder ball 1120 may be used to electrically connect the semiconductor devices 1130 through 1150 with one other.

Figure 13:
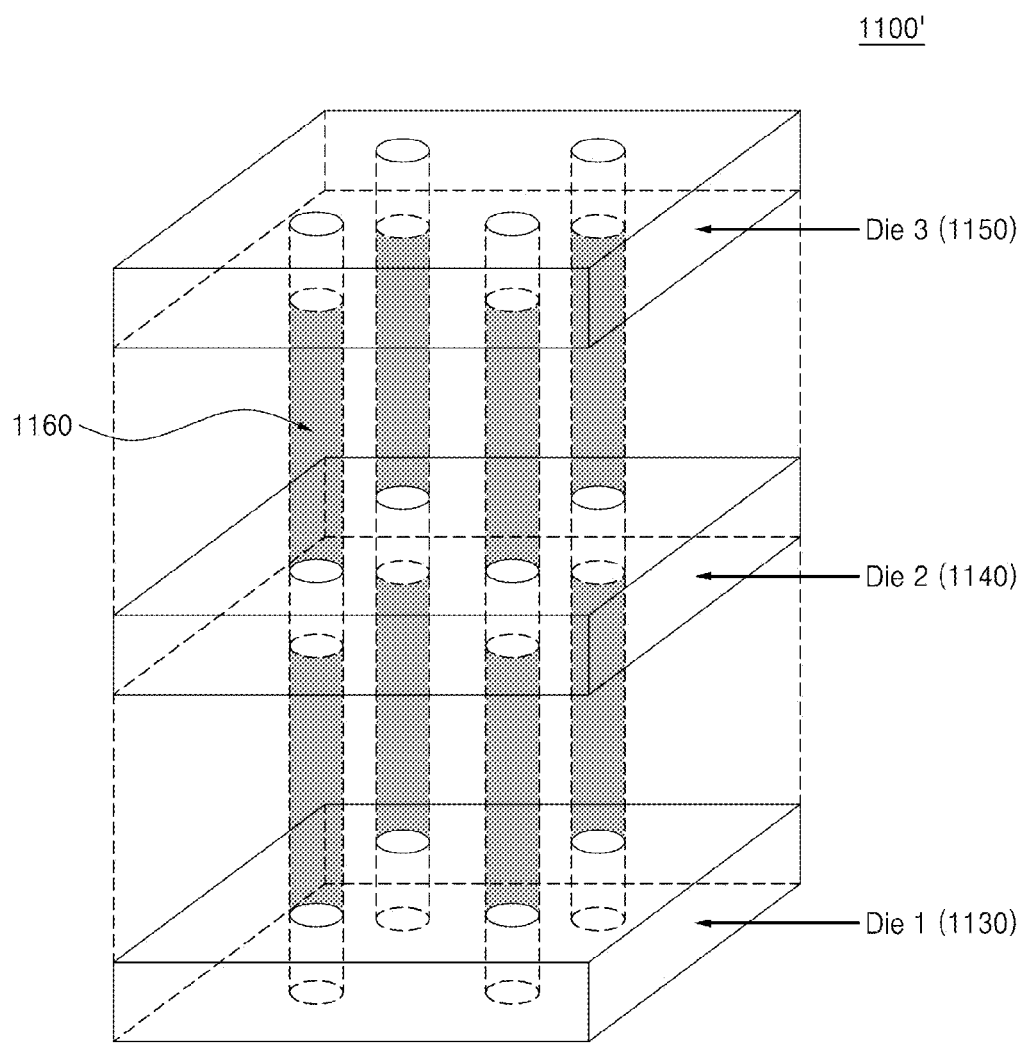
FIG. 13 is a three-dimensional conceptual diagram of an example of the multi-chip package illustrated in FIG. 12.

FIG. 13 is a three-dimensional conceptual diagram of an example 1100' of the multi-chip package 1100 illustrated in FIG. 12. Referring to FIGS. 12 and 13, the multi-chip package 1100' includes a plurality of the dies 1130 through 1150 connected with one another through TSVs 1160 in a stack structure. Each of the dies 1130 through 1150 may include a plurality of circuit blocks (not shown) and a periphery circuit to realize the functions of the semiconductor memory device 10. The dies 1130 through 1150 may be referred to as a cell array. The plurality of circuit blocks may be implemented by memory blocks.

The TSVs 1160 may be formed of a conductive material including a metal such as copper (Cu). The TSVs 1160 are arranged at the center of a silicon substrate. The silicon substrate surrounds the TSVs 1160. An insulating region (not shown) may be disposed between the TSVs 1160 and the silicon substrate.

According to at least some example embodiments of inventive concepts, in a semiconductor device having a separate source line structure, a voltage of each source line may be more easily set to a desired voltage. Thus, a current path may be formed using a relatively low voltage, and a direction of current may be more easily set to a direction from a bit line to a source line or a direction from the source line to the bit line.

Thus, a memory device according to an example embodiment of inventive concepts may operate with a relatively low voltage (e.g., a low voltage), thereby reducing power consumption.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of inventive concepts.

While inventive concepts has been particularly shown and described with reference to the example embodiments illustrated in the drawings, these embodiments are merely examples. It would be obvious to those of ordinary skill in the art that these embodiments are to cover all modifications, equivalents, and alternatives falling within the scope of inventive concepts. Accordingly, the technical scope of inventive concepts should be defined based on the technical idea of the appended claims.

What is claimed is:

1. A semiconductor device having a separate source line structure, the semiconductor device comprising:
    a resistive memory cell connected between a bit line and a source line, the resistive memory cell configured to store data;
    a source-line voltage supply circuit configured to apply a read source line voltage to the source line in response to a read column selection signal during a data read operation;
    a reference current generation circuit configured to generate reference current;
    a bit-line sense amplifier (S/A) circuit configured to sense and amplify the data stored in the resistive memory cell based on a comparison between cell current and the reference current, the cell current based on the data stored in the resistive memory cell;
    a read switching circuit between the resistive memory cell and the bit-line S/A circuit, the read switching circuit configured to operate in response to the read column selection signal; and
    a write switching circuit between the resistive memory cell and the bit-line S/A circuit, the write switching circuit configured to operate in response to a write column selection signal for writing data to the resistive memory cell.

2. The semiconductor device of claim 1, further comprising:
    a read-current source connected to the bit line to cause read current to flow to the source line via the resistive memory cell; wherein
    the read source line voltage is a ground voltage, and during the data read operation, the read current flows from the read-current source to the source line via the bit line.

3. The semiconductor device of claim 1, wherein
    the read source line voltage is a positive voltage; and read current flows from the source line to the bit line during the data read operation.

4. The semiconductor device of claim 1, wherein the bit-line S/A circuit comprises:
   a first line connected to the resistive memory cell, the first line configured to read the stored data from the resistive memory cell;
   a second line connected to the reference current generation circuit, the second line configured to read the stored data from the resistive memory cell;
   a third line connected to an input/output (I/O) circuit, the third line configured to receive data to be written to the resistive memory cell;
   a fourth line connected to the resistive memory cell, the fourth line configured to write the received data to the resistive memory cell;
   a cross-coupled latch circuit connected to the first line, the second line, and the third line; and
   a write latch circuit connected to the third and fourth lines, and to the cross-coupled latch circuit; wherein
      the write latch circuit is configured to operate in response to the write column selection signal.

5. The semiconductor device of claim 4, wherein
   during a data write operation, data received via the third line and latched by the cross-coupled latch circuit is stored in the resistive memory cell by the write latch circuit via the fourth line; and
   during the data read operation, the stored data read from the resistive memory cell via the second line is amplified by the cross-coupled latch circuit and output to the I/O circuit via the third line.

6. The semiconductor device of claim 5, wherein the bit-line S/A circuit further comprises:
   a fifth line, which is complementary to the third line, the fifth line configured to output complementary data for the read data to the I/O circuit;
   a pre-charging circuit configured to supply a pre-charge voltage or pre-charge current to the third line and the fifth line; and
   an equalizing circuit configured to equalize voltages of the third line and the fifth line.

7. The semiconductor device of claim 4, wherein the bit-line S/A circuit further comprises:
   an equalizing circuit configured to equalize voltages of the first line and the second line.

8. The semiconductor device of claim 4, further comprising:
   a first current mirror connected to the first line, the first current mirror configured to mirror current flowing through the resistive memory cell; wherein
      the read switching circuit is connected between the bit line and the first current mirror, and
      the write switching circuit is connected between the bit line and the fourth line.

9. The semiconductor device of claim 4, further comprising:
   a first current mirror connected to the first line, the first current mirror configured to mirror current flowing through the resistive memory cell; and
   a read-current source connected between the bit line and the first current mirror, the read-current source configured to cause read current to flow to the source line via the resistive memory cell; wherein
      the read switching circuit is connected between the bit line and the first current mirror, and
      the write switching circuit is connected between the bit line and the fourth line.

10. The semiconductor device of claim 1, wherein the reference current generation circuit comprises:
    a first reference memory cell configured to store first reference data;
    a second reference memory cell configured to store second reference data, the second reference data being different from the first reference data;
    a first reference-cell source line connected to the first reference memory cell;
    a second reference-cell source line connected to the second reference memory cell;
    a first reference-cell switch configured to supply a first reference-cell source line voltage to the first reference-cell source line during the data read operation; and
    a second reference-cell switch configured to supply a second reference-cell source line voltage to the second reference-cell source line during the data read operation.

11. The semiconductor device of claim 10, wherein during the data read operation, a read voltage is applied to the first reference-cell source line and the second reference-cell source line to control a first reference current flow from the first reference-cell source line via the first reference memory cell and a second reference current flow from the second reference-cell source line via the second reference memory cell.

12. A semiconductor device having a separate source line structure, the semiconductor device comprising:
    a resistive memory cell connected between a bit line and a source line, the resistive memory cell configured to store data;
    a reference current generation circuit configured to generate reference current; and
    a bit-line sense amplifier (S/A) circuit configured to sense and amplify the data stored in the resistive memory cell based on the reference current;
    wherein the bit-line S/A circuit includes
       a first line connected to the resistive memory cell, the first line configured to read the stored data from the resistive memory cell,
       a second line connected to the reference current generation circuit, the second line configured to read the stored data from the resistive memory cell,
       a third line configured to output the data read from the resistive memory cell to an input/output (I/O) circuit,
       a fourth line connected to the resistive memory cell, the fourth line configured to write data to the resistive memory cell,
       a fifth line, which is complementary to the third line, the fifth line configured to output complementary data for the read data to the I/O circuit,
       a cross-coupled latch circuit configured to receive write data via the third line and latch the write data during a data write operation, and
       a write latch circuit configured to
          receive the write data output from the cross-coupled latch circuit, and
          store the write data in the resistive memory cell via the fourth line during the data write operation.

13. The semiconductor device of claim 12, wherein the write latch circuit is configured to be deactivated during a data read operation.

14. The semiconductor device of claim 12, wherein the cross-coupled latch circuit is configured to compare and amplify cell current based on the resistive memory cell and the reference current during a data read operation.

15. The semiconductor device of claim 12, further comprising:
    a read-current source connected to the bit line, the read-current source configured to cause read current to flow to the source line via the resistive memory cell.

16. The semiconductor device of claim 12, further comprising:
    a source-line voltage supply circuit connected to the source line, the source-line voltage supply circuit configured to
    supply a source line voltage to the source line, and
    cause read current to flow from the source line via the resistive memory cell during a data read operation.

17. A semiconductor device comprising:
    a bit-line sense amplifier (S/A) circuit configured to sense and amplify data stored in a resistive memory cell according to a reference current, the resistive memory cell connected between a bit line and a source line, the bit-line S/A circuit including
        a cross-coupled latch circuit coupled to an input/output circuit via a first line and a complementary first line, the cross-coupled latch circuit configured to receive write data via the first line, and to latch the write data during a data write operation, and
        a write latch circuit coupled to the cross-coupled latch circuit, the write latch circuit configured to store the write data in the resistive memory cell via a second line during the data write operation;
    a read switching circuit between the resistive memory cell and the bit-line S/A circuit, the read switching circuit configured to operate in response to a read column selection signal for reading the stored data from the resistive memory cell; and
    a write switching circuit between the resistive memory cell and the bit-line S/A circuit, the write switching circuit configured to operate in response to a write column selection signal for writing data to the resistive memory cell.

18. The semiconductor device of claim 17, wherein the write latch circuit is further configured to be activated during the data write operation and deactivated during a read operation on the resistive memory cell.

19. The semiconductor device of claim 17, wherein the semiconductor device has a separate source line structure.

\* \* \* \* \*